United States Patent [19]
Kumagai

[11] Patent Number: 5,151,794
[45] Date of Patent: Sep. 29, 1992

[54] IMAGE PROCESSING METHOD
[75] Inventor: Ryohei Kumagai, Tokyo, Japan
[73] Assignee: Ezel Inc., Tokyo, Japan
[21] Appl. No.: 302,350
[22] Filed: Jan. 27, 1989
[51] Int. Cl.$^5$ .............................................. H04H 1/40
[52] U.S. Cl. .................... 358/447; 358/463
[58] Field of Search ................................ 358/447, 463

[56] References Cited
U.S. PATENT DOCUMENTS

| | | | |
|---|---|---|---|
| 4,509,195 | 4/1985 | Nadler | 358/447 |
| 4,626,902 | 12/1986 | Yamada | 358/447 |
| 4,665,556 | 5/1987 | Fukushima et al. | 382/41 |
| 4,841,374 | 6/1989 | Kotami | 358/447 |

OTHER PUBLICATIONS

Jacob Millman, Micro-Electronics Digital and Analog Circuits and Systems, pp. 176-180.

Primary Examiner—Edward J. Coles, Sr.

[57] ABSTRACT

A image processing method smooths edges. An image is represented as pixels. A plurality of groups of pixels are formed. A median is calculated for each group, and a median of medians is calculated. Pixels in groups are altered according to the median of medians to generate a smooth image.

10 Claims, 31 Drawing Sheets

| a | a | a |
|---|---|---|
| b | b | b |
| c | c | c |

(2)

| a | b | c |
|---|---|---|
| a | b | c |
| a | b | c |

FIG. 2 (CON'T)

FIG. 3 (CON'T)

FIG. 4 (CON'T) -1

(16)
| a | a | b |
|---|---|---|
| c | b | a |
| b | c | c |

(17)
| a | a | b |
|---|---|---|
| c | b | a |
| c | b | c |

(18)
| a | a | b |
|---|---|---|
| c | b | a |
| c | c | b |

(19)
| a | a | b |
|---|---|---|
| b | c | c |
| a | b | c |

(20)
| a | a | b |
|---|---|---|
| b | c | c |
| a | c | b |

(21)
| a | a | b |
|---|---|---|
| c | b | c |
| a | b | c |

(22)
| a | a | b |
|---|---|---|
| c | b | c |
| a | c | b |

(23)
| a | a | b |
|---|---|---|
| c | c | b |
| a | b | c |

(24)
| a | a | b |
|---|---|---|
| c | c | b |
| a | c | b |

(25)
| a | a | b |
|---|---|---|
| b | c | c |
| b | a | c |

(26)
| a | a | b |
|---|---|---|
| b | c | c |
| c | a | b |

(27)
| a | a | b |
|---|---|---|
| c | b | c |
| b | a | c |

(28)
| a | a | b |
|---|---|---|
| c | b | c |
| c | a | b |

(29)
| a | a | b |
|---|---|---|
| c | c | b |
| b | a | c |

(30)
| a | a | b |
|---|---|---|
| c | c | b |
| c | a | b |

FIG. 4 (CON'T)-2

(31)
| a | a | b |
|---|---|---|
| b | c | c |
| b | c | a |

(32)
| a | a | b |
|---|---|---|
| b | c | c |
| c | b | a |

(33)
| a | a | b |
|---|---|---|
| c | b | c |
| b | c | a |

(34)
| a | a | b |
|---|---|---|
| c | b | c |
| c | b | a |

(35)
| a | a | b |
|---|---|---|
| c | c | b |
| b | c | a |

(36)
| a | a | b |
|---|---|---|
| c | c | b |
| c | b | a |

(37)
| a | b | a |
|---|---|---|
| a | b | c |
| b | c | c |

(38)
| a | b | a |
|---|---|---|
| a | b | c |
| c | b | c |

(39)
| a | b | a |
|---|---|---|
| a | b | c |
| c | c | b |

(40)
| a | b | a |
|---|---|---|
| a | c | b |
| b | c | c |

(41)
| a | b | a |
|---|---|---|
| a | c | b |
| c | b | c |

(42)
| a | b | a |
|---|---|---|
| a | c | b |
| c | c | b |

(43)
| a | b | a |
|---|---|---|
| b | a | c |
| b | c | c |

(44)
| a | b | a |
|---|---|---|
| b | a | c |
| c | b | c |

(45)
| a | b | a |
|---|---|---|
| b | a | c |
| c | c | b |

FIG. 4 (CON'T) -3

(46)
| a | b | a |
|---|---|---|
| c | a | b |
| b | c | c |

(47)
| a | b | a |
|---|---|---|
| c | a | b |
| c | b | c |

(48)
| a | b | a |
|---|---|---|
| c | a | b |
| c | c | b |

(49)
| a | b | a |
|---|---|---|
| b | c | a |
| b | c | c |

(50)
| a | b | a |
|---|---|---|
| b | c | a |
| c | b | c |

(51)
| a | b | a |
|---|---|---|
| b | c | a |
| c | b | c |

(52)
| a | b | a |
|---|---|---|
| c | b | a |
| b | c | c |

(53)
| a | b | a |
|---|---|---|
| c | b | a |
| c | b | c |

(54)
| a | b | a |
|---|---|---|
| c | b | a |
| c | c | b |

(55)
| a | b | a |
|---|---|---|
| b | c | c |
| a | b | c |

(56)
| a | b | a |
|---|---|---|
| b | c | c |
| a | c | b |

(57)
| a | b | a |
|---|---|---|
| c | b | c |
| a | b | c |

(58)
| a | b | a |
|---|---|---|
| c | b | c |
| a | c | b |

(59)
| a | b | a |
|---|---|---|
| c | c | b |
| a | b | c |

(60)
| a | b | a |
|---|---|---|
| c | c | b |
| a | c | b |

FIG. 4 (CON'T)-4

(61)
| a | b | a |
|---|---|---|
| b | c | c |
| b | a | c |

(62)
| a | b | a |
|---|---|---|
| b | c | c |
| c | a | b |

(63)
| a | b | a |
|---|---|---|
| c | b | c |
| b | a | c |

(64)
| a | b | a |
|---|---|---|
| c | b | c |
| c | a | b |

(65)
| a | b | a |
|---|---|---|
| c | c | b |
| b | a | c |

(66)
| a | b | a |
|---|---|---|
| c | c | b |
| c | a | b |

(67)
| a | b | a |
|---|---|---|
| b | c | c |
| b | c | a |

(68)
| a | b | a |
|---|---|---|
| b | c | c |
| c | b | a |

(69)
| a | b | a |
|---|---|---|
| c | b | c |
| b | c | a |

(70)
| a | b | a |
|---|---|---|
| c | b | c |
| c | b | a |

(71)
| a | b | a |
|---|---|---|
| c | c | b |
| b | c | a |

(72)
| a | b | a |
|---|---|---|
| c | c | b |
| c | b | a |

(73)
| a | b | c |
|---|---|---|
| a | a | b |
| b | c | c |

(74)
| a | b | c |
|---|---|---|
| a | a | b |
| c | b | c |

(75)
| a | b | c |
|---|---|---|
| a | a | b |
| c | c | b |

FIG. 4 (CON'T) -5

(76)

| a | b | c |
|---|---|---|
| a | a | c |
| b | b | c |

(77)

| a | b | c |
|---|---|---|
| a | a | c |
| b | c | b |

(78)

| a | b | c |
|---|---|---|
| a | a | c |
| c | b | b |

(79)

| a | b | c |
|---|---|---|
| a | b | a |
| b | c | c |

(80)

| a | b | c |
|---|---|---|
| a | b | a |
| c | b | c |

(81)

| a | b | c |
|---|---|---|
| a | b | a |
| c | c | b |

(82)

| a | b | c |
|---|---|---|
| a | c | a |
| b | b | c |

(83)

| a | b | c |
|---|---|---|
| a | c | a |
| b | c | b |

(84)

| a | b | c |
|---|---|---|
| a | c | a |
| c | b | b |

(85)

| a | b | b |
|---|---|---|
| a | b | c |
| a | c | c |

(86)

| a | b | b |
|---|---|---|
| a | c | b |
| a | c | c |

(87)

| a | b | b |
|---|---|---|
| a | c | c |
| a | b | c |

(88)

| a | b | b |
|---|---|---|
| a | c | c |
| a | c | b |

(89)

| a | b | c |
|---|---|---|
| a | b | b |
| a | c | c |

(90)

| a | b | c |
|---|---|---|
| a | c | c |
| a | b | b |

FIG. 4 (CON'T) -6

(91)
| a | b | b |
|---|---|---|
| a | b | c |
| c | a | c |

(92)
| a | b | b |
|---|---|---|
| a | c | b |
| c | a | c |

(93)
| a | b | b |
|---|---|---|
| a | c | c |
| b | a | c |

(94)
| a | b | b |
|---|---|---|
| a | c | c |
| c | a | b |

(95)
| a | b | c |
|---|---|---|
| a | b | b |
| c | a | c |

(96)
| a | b | c |
|---|---|---|
| a | c | c |
| b | a | b |

(97)
| a | b | b |
|---|---|---|
| a | b | c |
| c | c | a |

(98)
| a | b | b |
|---|---|---|
| a | c | b |
| c | c | a |

(99)
| a | b | b |
|---|---|---|
| a | c | c |
| b | c | a |

(100)
| a | b | b |
|---|---|---|
| a | c | c |
| c | b | a |

(101)
| a | b | c |
|---|---|---|
| a | b | b |
| c | c | a |

(102)
| a | b | c |
|---|---|---|
| a | c | c |
| b | b | a |

(103)
| a | b | c |
|---|---|---|
| b | a | a |
| b | c | c |

(104)
| a | b | c |
|---|---|---|
| b | a | a |
| c | b | c |

(105)
| a | b | c |
|---|---|---|
| b | a | a |
| c | c | b |

FIG. 4 (CON'T) -7

(106)
| a | b | c |
|---|---|---|
| c | a | a |
| b | b | c |

(107)
| a | b | c |
|---|---|---|
| c | a | a |
| b | c | b |

(108)
| a | b | c |
|---|---|---|
| c | a | a |
| c | b | b |

(109)
| a | b | b |
|---|---|---|
| b | a | c |
| a | c | c |

(110)
| a | b | b |
|---|---|---|
| c | a | b |
| a | c | c |

(111)
| a | b | b |
|---|---|---|
| c | a | c |
| a | b | c |

(112)
| a | b | b |
|---|---|---|
| c | a | c |
| a | c | b |

(113)
| a | b | c |
|---|---|---|
| b | a | b |
| a | c | c |

(114)
| a | b | c |
|---|---|---|
| c | a | c |
| a | b | b |

(115)
| a | b | b |
|---|---|---|
| b | a | c |
| c | a | c |

(116)
| a | b | b |
|---|---|---|
| c | a | b |
| c | a | c |

(117)
| a | b | b |
|---|---|---|
| c | a | c |
| b | a | c |

(118)
| a | b | b |
|---|---|---|
| c | a | c |
| c | a | b |

(119)
| a | b | c |
|---|---|---|
| b | a | b |
| c | a | c |

(120)
| a | b | c |
|---|---|---|
| c | a | c |
| b | a | b |

FIG. 4 (CON'T)-8

(121)
| a | b | b |
|---|---|---|
| b | a | c |
| c | c | a |

(122)
| a | b | b |
|---|---|---|
| c | a | b |
| c | c | a |

(123)
| a | b | b |
|---|---|---|
| c | a | c |
| b | c | a |

(124)
| a | b | b |
|---|---|---|
| c | a | c |
| c | b | a |

(125)
| a | b | c |
|---|---|---|
| b | a | b |
| c | c | a |

(126)
| a | b | c |
|---|---|---|
| c | a | c |
| b | b | a |

(127)
| a | b | b |
|---|---|---|
| b | c | a |
| a | c | c |

(128)
| a | b | b |
|---|---|---|
| c | b | a |
| a | c | c |

(129)
| a | b | b |
|---|---|---|
| c | c | a |
| a | b | c |

(130)
| a | b | b |
|---|---|---|
| c | c | a |
| a | c | b |

(131)
| a | b | c |
|---|---|---|
| b | b | a |
| a | c | c |

(132)
| a | b | c |
|---|---|---|
| c | c | a |
| a | b | b |

(133)
| a | b | b |
|---|---|---|
| b | c | a |
| c | a | c |

(134)
| a | b | b |
|---|---|---|
| c | b | a |
| c | a | c |

(135)
| a | b | b |
|---|---|---|
| c | c | a |
| b | a | c |

FIG. 4 (CON'T)-9

(136)
| a | b | b |
|---|---|---|
| c | c | a |
| c | a | b |

(137)
| a | b | c |
|---|---|---|
| b | b | a |
| c | a | c |

(138)
| a | b | c |
|---|---|---|
| c | c | a |
| b | a | b |

(139)
| a | b | b |
|---|---|---|
| b | c | a |
| c | c | a |

(140)
| a | b | b |
|---|---|---|
| c | b | a |
| c | c | a |

(141)
| a | b | b |
|---|---|---|
| c | c | a |
| b | c | a |

(142)
| a | b | b |
|---|---|---|
| c | c | a |
| c | b | a |

(143)
| a | b | c |
|---|---|---|
| b | b | a |
| c | c | a |

(144)
| a | b | c |
|---|---|---|
| c | c | a |
| b | b | a |

(145)
| a | b | c |
|---|---|---|
| b | b | c |
| a | a | c |

(146)
| a | b | c |
|---|---|---|
| b | c | b |
| a | a | c |

(147)
| a | b | c |
|---|---|---|
| b | c | c |
| a | a | b |

(148)
| a | b | c |
|---|---|---|
| c | b | b |
| a | a | c |

(149)
| a | b | c |
|---|---|---|
| c | b | c |
| a | a | b |

(150)
| a | b | c |
|---|---|---|
| c | c | b |
| a | a | b |

FIG. 4 (CON'T)-10

FIG. 5(CON'T)-1

(16)
| a | a | b |
|---|---|---|
| b | b | c |
| c | c | a |

(17)
| a | a | b |
|---|---|---|
| b | c | b |
| c | c | a |

(18)
| a | a | b |
|---|---|---|
| c | b | b |
| c | c | a |

(19)
| a | b | a |
|---|---|---|
| a | c | c |
| b | b | c |

(20)
| a | b | a |
|---|---|---|
| a | c | c |
| b | c | b |

(21)
| a | b | a |
|---|---|---|
| a | c | c |
| c | b | b |

(22)
| a | b | a |
|---|---|---|
| c | a | c |
| b | b | c |

(23)
| a | b | a |
|---|---|---|
| c | a | c |
| b | c | b |

(24)
| a | b | a |
|---|---|---|
| c | a | c |
| c | b | b |

(25)
| a | b | a |
|---|---|---|
| c | c | a |
| b | b | c |

(26)
| a | b | a |
|---|---|---|
| c | c | a |
| b | c | b |

(27)
| a | b | a |
|---|---|---|
| c | c | a |
| c | b | b |

(28)
| a | b | a |
|---|---|---|
| b | b | c |
| a | c | c |

(29)
| a | b | a |
|---|---|---|
| b | c | b |
| a | c | c |

(30)
| a | b | a |
|---|---|---|
| c | b | b |
| a | c | c |

FIG. 5 (CON'T) -2

(31)
| a | b | a |
|---|---|---|
| b | b | c |
| c | a | c |

(32)
| a | b | a |
|---|---|---|
| b | c | b |
| c | a | c |

(33)
| a | b | a |
|---|---|---|
| c | b | b |
| c | a | c |

(34)
| a | b | a |
|---|---|---|
| b | b | c |
| c | c | a |

(35)
| a | b | a |
|---|---|---|
| b | c | b |
| c | c | a |

(36)
| a | b | a |
|---|---|---|
| c | b | b |
| c | c | a |

(37)
| a | b | b |
|---|---|---|
| a | a | c |
| b | c | c |

(38)
| a | b | b |
|---|---|---|
| a | a | c |
| c | b | c |

(39)
| a | b | b |
|---|---|---|
| a | a | c |
| c | c | b |

(40)
| a | b | b |
|---|---|---|
| a | c | a |
| b | c | c |

(41)
| a | b | b |
|---|---|---|
| a | c | a |
| c | b | c |

(42)
| a | b | b |
|---|---|---|
| a | c | a |
| c | c | b |

(43)
| a | b | b |
|---|---|---|
| c | a | a |
| b | c | c |

(44)
| a | b | b |
|---|---|---|
| c | a | a |
| c | b | c |

(45)
| a | b | b |
|---|---|---|
| c | a | a |
| c | c | b |

FIG. 5 (CON'T)-3

| a | b | c |
|---|---|---|
| d | e | f |
| g | h | i |

FIG. 15

| a | b | c | d | e |
|---|---|---|---|---|
| f | g | h | i | j |
| k | l | m | n | o |
| p | q | r | s | t |
| u | v | w | x | y |

(a) 
(b) 
(c) 
(d)

(e) 
(f) 
(g) 
(h)

(i) 
(j) 
(k) 
(l)

IMAGE PROCESSING METHOD

FIELD OF THE INVENTION

The present invention relates to an image processing method, particularly for smoothing without dulling edge.

BACKGROUND OF THE INVENTION

For eliminating noises in an image, a local averaging method for smoothing is usually applied, because this method can be easily executed by a software of a local spatial calculation. In the present large scale image processing system, an image is processed for the above smoothing in 32 msec.

The local averaging method dulls edges of a configuration and makes the image unclear as well as of low resolution. In order to solve this problem, various methods for smoothing without dulling edges have been proposed, such as the so-called Nagao method, local selecting method of pixels, hysteresis smoothing method, median filter method and E-filter method in frequency space. Of these methods the, median filter method is well known because of the high quality of its process result. However, the methods of smoothing without dulling edges, including the median filter method, need long process time and are difficult to be executed by hardware. These methods cannot be applied to processes that must be performed with high process speed.

SUMMARY OF THE INVENTION

Therefore, the present invention has an object to provide an image processing method for smoothing without dulling edges.

According to the present invention, convolution areas of predetermined size are successively read out. Pixels in each convolution area are divided into a plurality of groups, and the median value of each group is calculated. The median value of the median values of the groups is calculated, and is defined as a representative value of the convolution.

BRIEF DESCRIPTION OF THE DRAWINGS

FIG. 1 shows a first type of grouping of a first embodiment of the present invention;

FIG. 2 shows a second type grouping of the embodiment;

FIG. 3 shows a third type grouping of the embodiment;

FIG. 4 shows a fourth type grouping of the embodiment;

FIG. 5 shows a fifth type grouping of the embodiment;

FIG. 14 shows a $3 \times 3$ convolution for describing the second embodiment;

FIG. 15 shows a $5 \times 5$ convolution for describing the second embodiment;

PREFERRED EMBODIMENT OF THE PRESENT INVENTION

Figure 6:
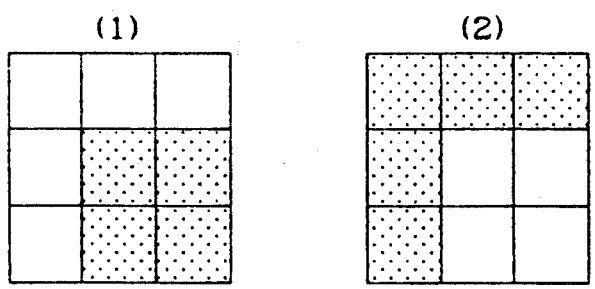
FIG. 6 shows dot patterns comparing the process result of the first grouping with a conventional median filter.

Exemplary preferred embodiments of the image processing method according to the present invention will be described in detail hereinafter.

Figure 1:
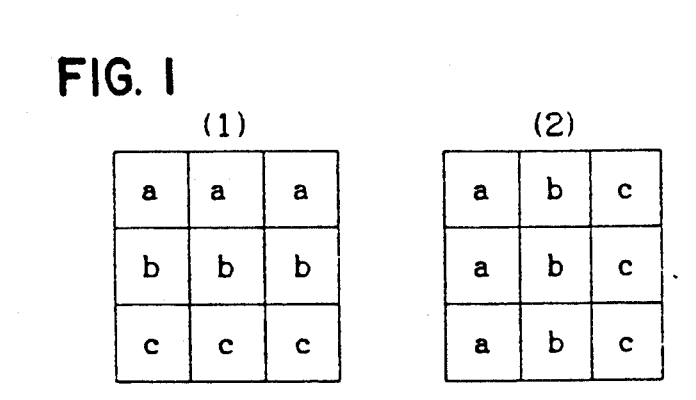

In FIGS. 1 (1) and (2), $3 \times 3$ convolutions to be read out are shown in which references a, b, and c are given to pixels. These references represent groups for separating pixels. Each group includes 3 pixels vertically or horizontally aligned.

As for a $3 \times 3$ convolution including 9 pixels, the number of combinations of groupings for generating 3 groups each of which include 3 pixels is calculated as follows;

$$ {}_9C_3 \times {}_6C_3/3! = 280 \quad \text{where } {}_nC_r = \frac{n!}{r!(n-r)!} $$

All types of groupings are shown in FIGS. 1 to 5. The grouping in FIG. 1 is the most simple type.

For each grouping, smoothing without dulling edge is performed by the following calculation.

$$ \text{Med}\{\text{Med}\{a,a,a\}, \text{Med}\{b,b,b\}, \text{Med}\{c,c,c\}\} $$

where, a: Density of each pixel in the group represented by the reference "a";
b: Density of each pixel in the group represented by the reference "b";
c: Density of each pixel in the group represented by the reference "c"; and
Med: Operator for extracting median value.

In this calculation, the total number N1 of sorting times is, $$ N1 = (\tfrac{1}{2})n(n-1)^2 \tag{2} $$

where, n is the number of groups as well as the number of pixels in each group, "3" in this case.

The conventional median filter for an $n \times n$ convolution needs a total number N2 of sorting times calculated as follows;

$$ N2 = (\tfrac{1}{2})n^2(n^2 - 1) \tag{3} $$

N1 is smaller than N2/n, so the first embodiment has a much higher process speed than a conventional median filter. In the $3 \times 3$ convolution, the first embodiment has a process speed 6 times that of the conventional median filter.

FIGS. 8A-13C show printer outputs of a process result by an embodiment of the present invention and by a conventional median filter.

Figure 8A:
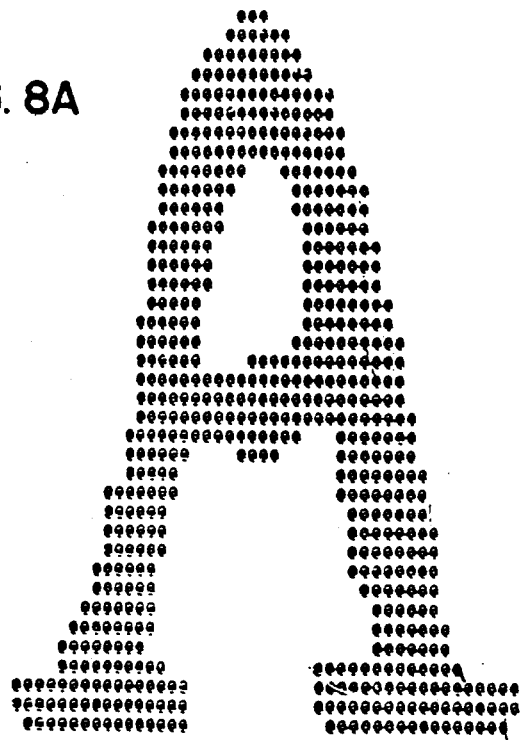
FIGS. 8 A-C shows printer outputs for comparing process result of the first grouping with a conventiona median filter.
Figure 8B:
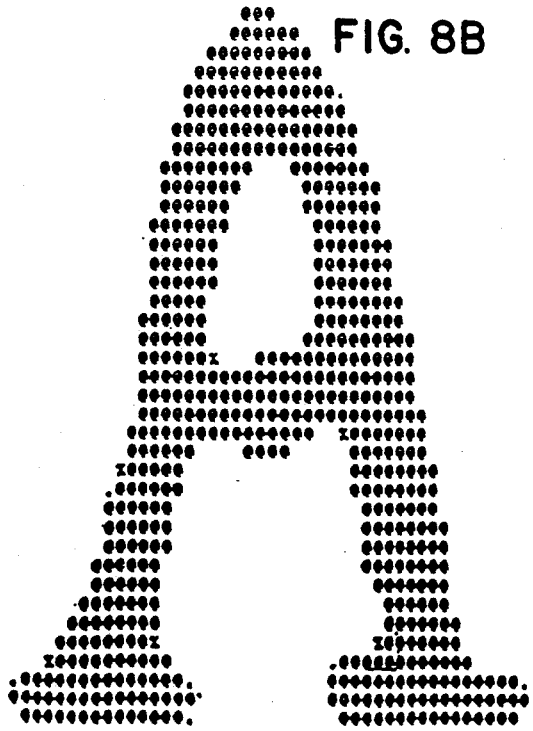
Figure 8C:
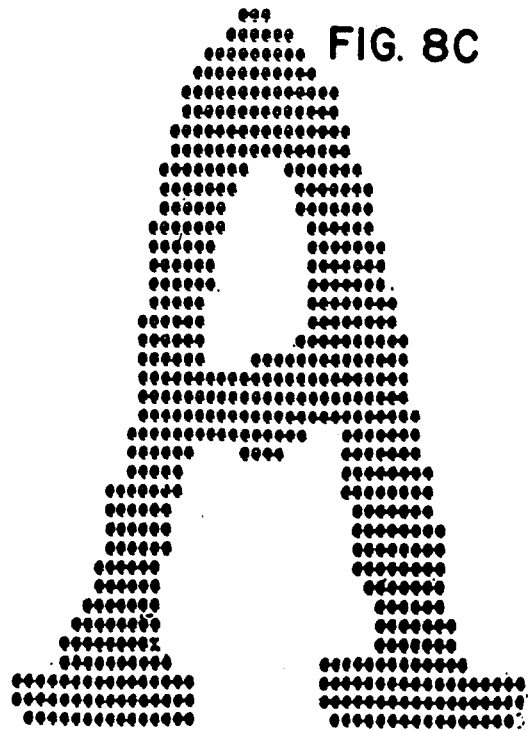

FIGS. 8A-8C shows a process result for an image without noise.

Figure 9A:
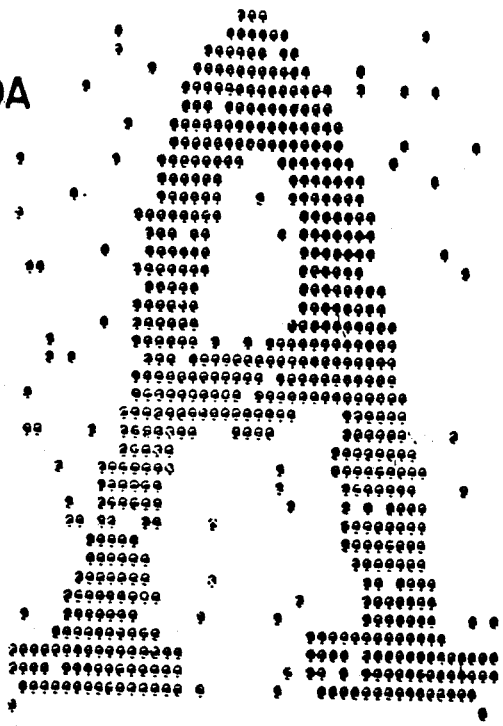
FIGS. 9 A-C to 13 A-C show other printer outputs.
Figure 9B:
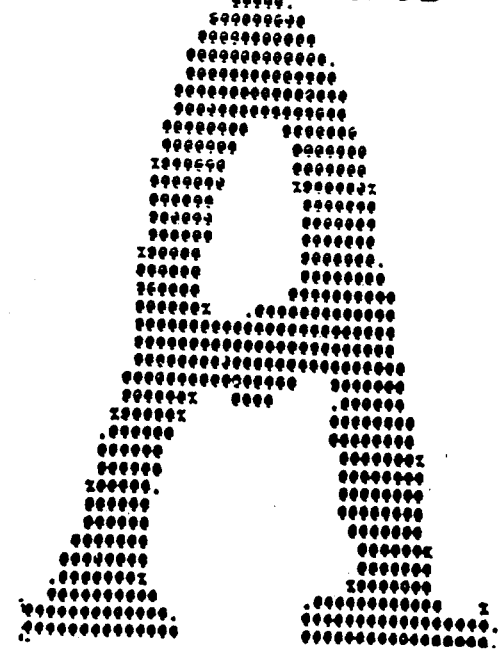
Figure 9C:
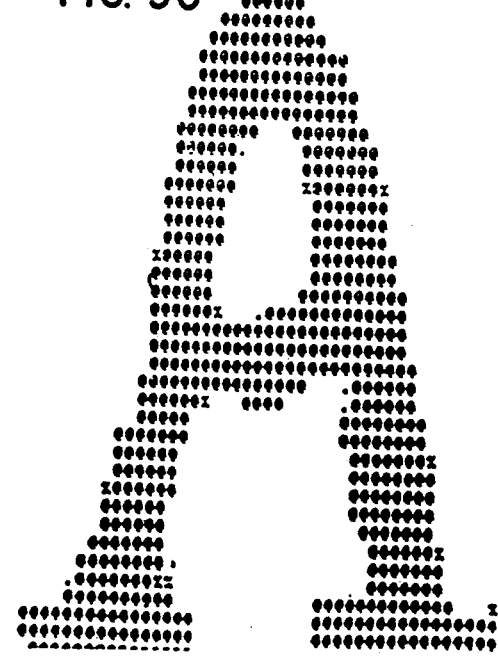
Figure 10A:
Figure 10B:
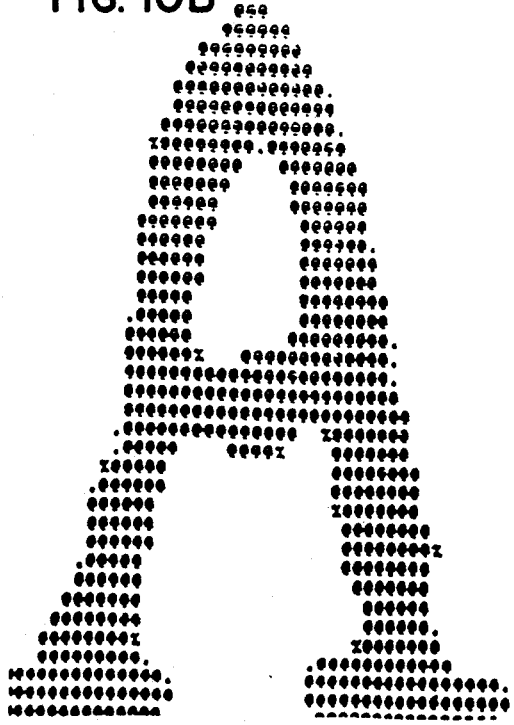
Figure 10C:
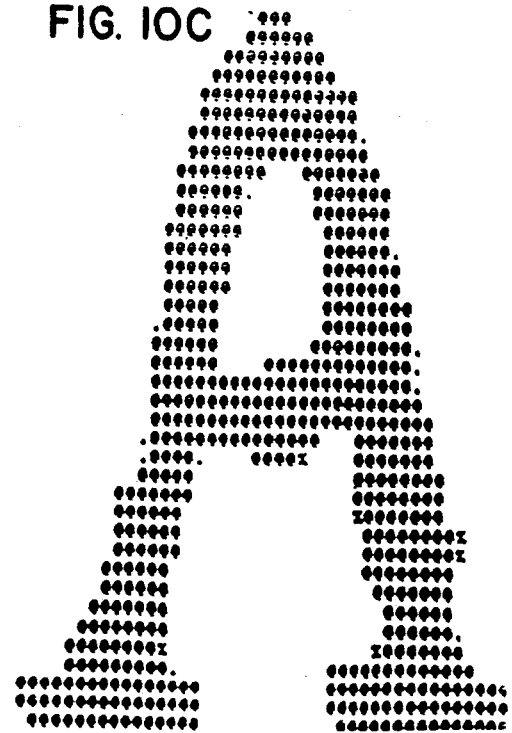
Figure 11A:
Figure 11B:
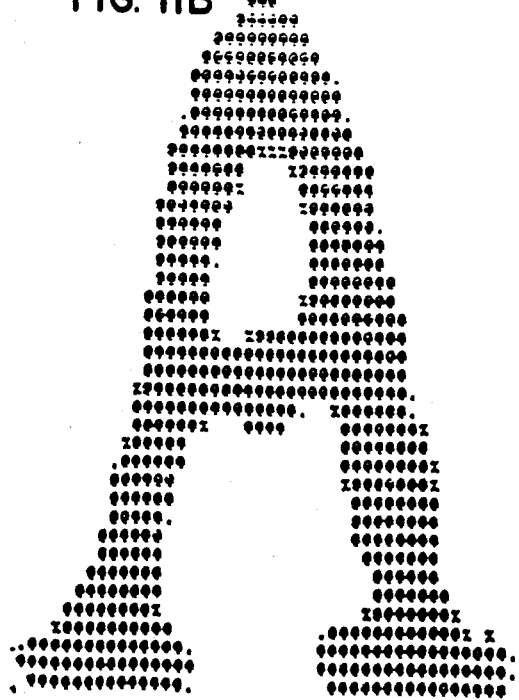
Figure 11C:
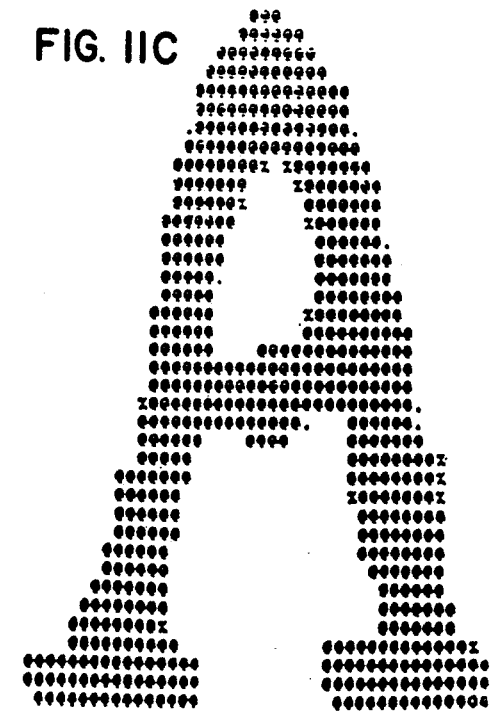
Figure 12A:
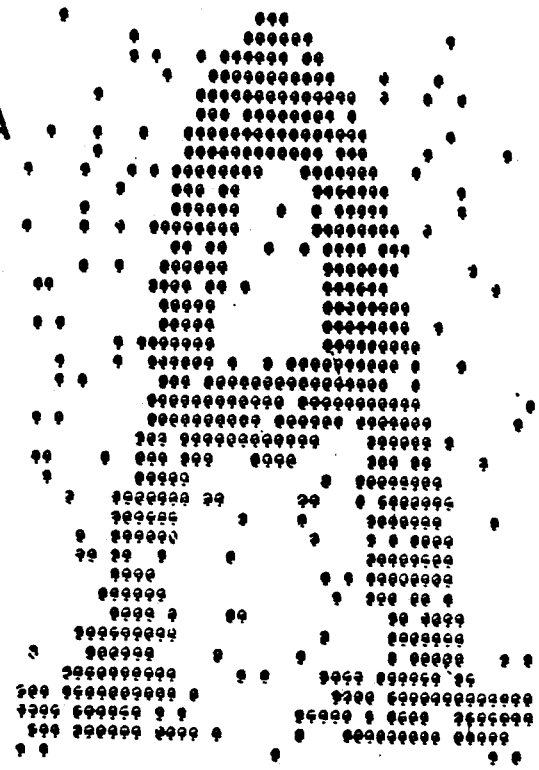
Figure 12B:
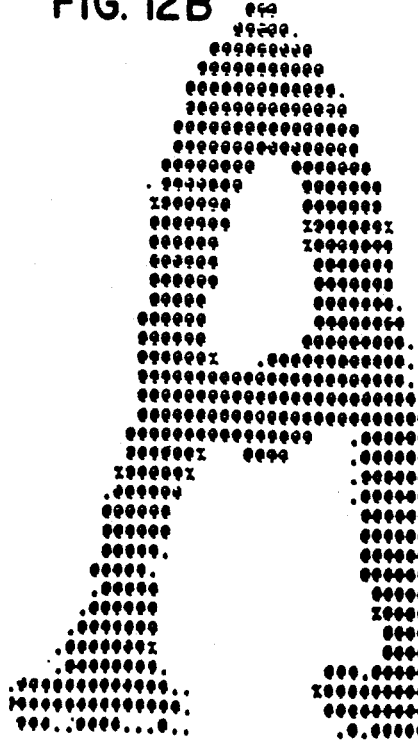
Figure 12C:
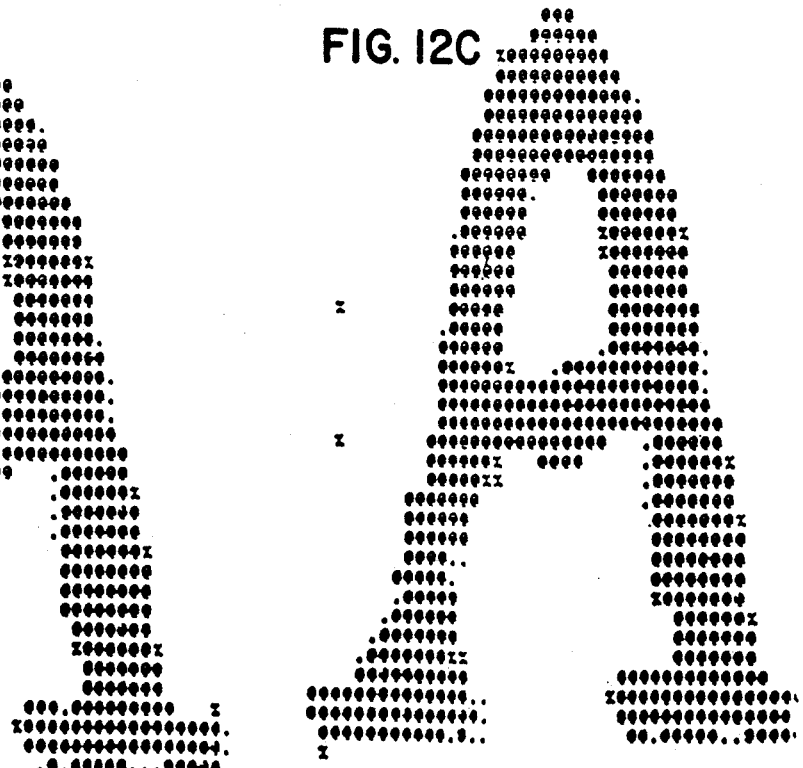

In FIGS. 8A-8C each dot is represented by "@". The original image is in FIG. 8(A), the process result by the conventional median filter is in FIG. 8(B) and the process result by the embodiment is in FIG. 8(C). In the images of FIGS. 8(B) and 8(C), "%" represents a pixel generated by the process but not included in the original image represents a pixel deleted by the process but included in the original image. The number of modified pixels in FIG. 8(B) is 13, while the number in FIG. 8(C) is 1. From these numbers, the process of this embodiment is seen as much better in the quality of the process result as compared to the conventional median filter. A ratio of the number of correct, or not changed, pixels divided by total pixel number of original image without noise is an index for evaluating the quality of the process result. This ratio is now called "preservation ratio". The preservation ratio of the embodiment is 99.9%, while the ratio of a conventional median filter is 99.3%. The images to be processed in FIGS. 9(A), 10(A) and 11(A) are designated as 9A–11A, respectively, and include noise of 5%. The images to be processed in FIGS. 12(A) and 13(B) are designated as 12A and 13A, respectively, and include noise of 10%. In Table 1, the preservation ratio of the embodiment and a conventional median filter with respect to images in FIGS. 8(A), 9(A), 10(A), 11(A), 12(A) and 13(A) are compared.

TABLE 1

Figure 13A:
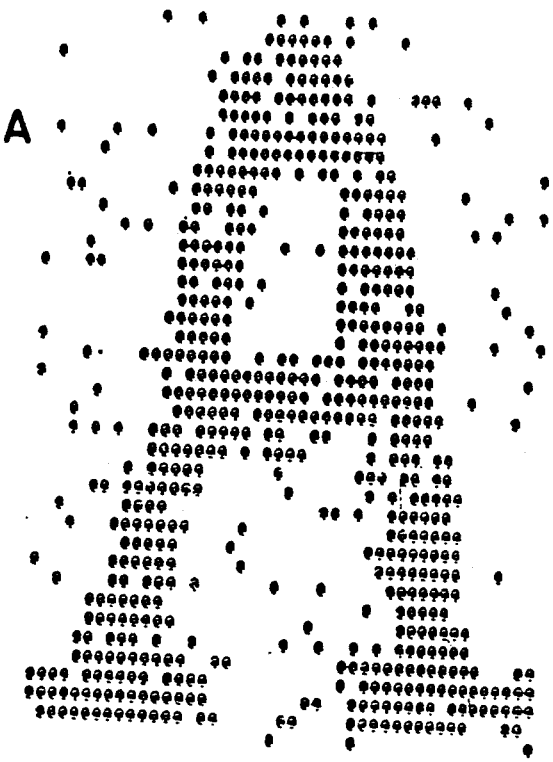
Figure 13B:
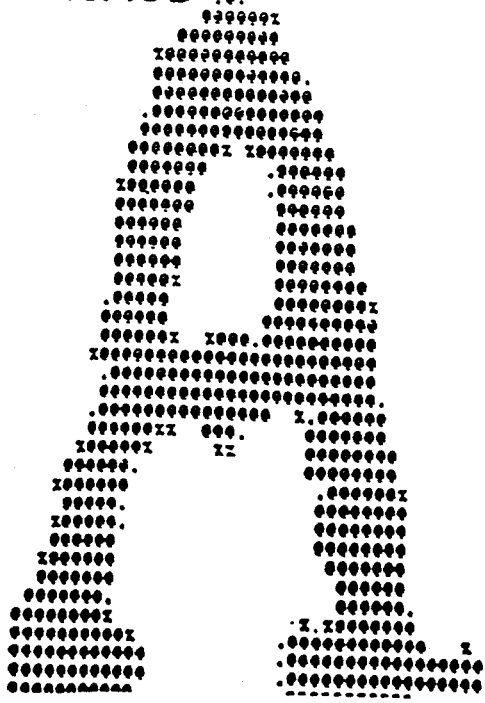
Figure 13C:
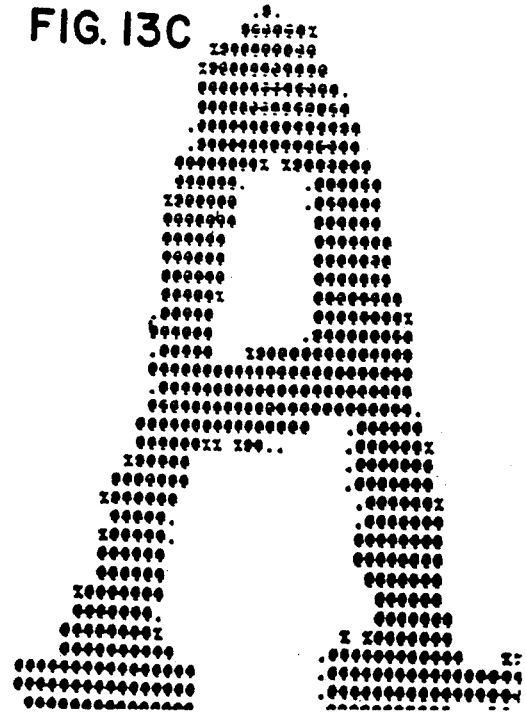

| Image to be processed | Noise % | Process result of the embodiment | | Process result of the conventional median filter | |
|---|---|---|---|---|---|
| | | Error pixels | Preservation ratio (%) | Error pixels | Preservation ratio (%) |
| FIG. 8A | 0 | 1 | 99.9 | 13 | 99.3 |
| FIG. 9A | 5 | 18 | 99.0 | 30 | 98.2 |
| FIG. 10A | 5 | 18 | 99.0 | 28 | 98.4 |
| FIG. 11A | 5 | 22 | 98.7 | 39 | 97.8 |
| FIG. 12A | 10 | 50 | 97.1 | 54 | 96.9 |
| FIG. 13A | 10 | 53 | 97.0 | 53 | 97.0 |

The preservation ratio represents the elimination quality as well, because the preservation ratio is identical with the identification ratio of the processed image to the original image without noise.

The reason why the process according to the present invention has high quality is that the process evaluates pixels from a broader point of view than the conventional median filter.

As for the dot pattern in FIG. 6 (1), the center pixel at the right angle convex corner is deleted in the conventional median filter. As for the dot pattern in FIG. 6 (2), a center pixel is added on the right angle concave corner in the conventional median filter. This is a problem of the conventional median filter in preserving the original image.

In the process of the first embodiment, the dot patterns in FIGS. 6 (1) and (2) are preserved as they are.

Figure 7:
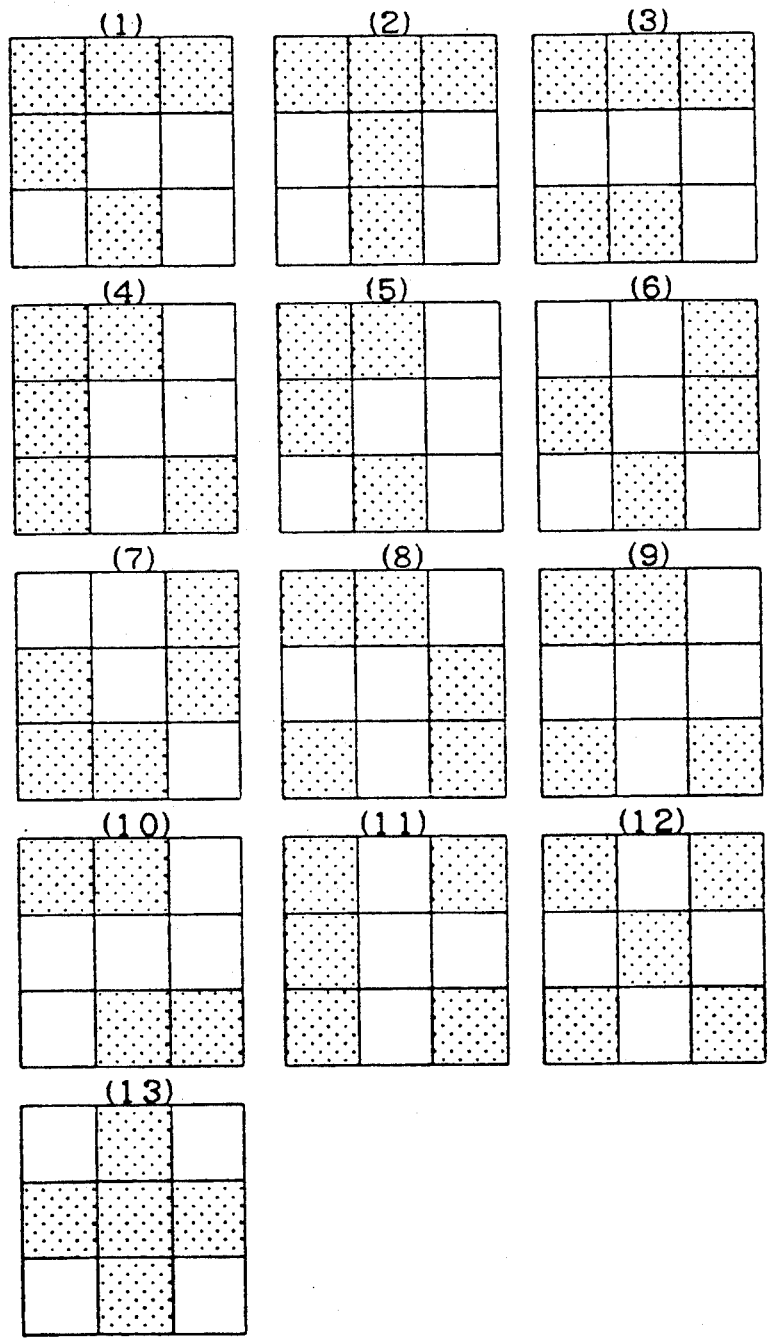
FIG. 7 shows dot patterns comparing the process result of the second grouping with a conventional median filter.

FIG. 2 shows the second grouping of the first embodiment. By this grouping, the process result is similar to that of the first grouping. In FIGS. 7 (1) to (3), dot patterns are shown, which are processed to be higher quality images by using the second grouping, rather than the first grouping. In FIGS. 7 (4) to (13), there are shown patterns occasionally better in the process result of the second grouping than the first. The patterns rotationally or axially symmetric to the patterns in FIGS. 7 (4) to (13) are the same.

FIGS. 7 (1), (6) and (7) are patterns corresponding to an acute concavity with 45 degree. Such configurations hardly exist in natural images. The corner point in the concavity can be deemed to be a pixel accidentally deleted. The process according to the second grouping can fill the corner point with a pixel of the configuration's density.

FIG. 7 (2) shows a T-shaped pattern. The center pixel of the vertical line of the T-shape should not be deleted. In the reversed dot pattern, the corresponding pixel should not be filled with configuration's density. The process according to the second grouping generates a process result for the T-shaped pattern meeting the above requirement. The rotationally or axially symmetric patterns are processed the same.

FIG. 7 (3) shows a rotated and reversed L-shaped pattern. The center pixel of the vertical line of the L-shape should not be filled with configuration's density. In a not reversed pattern, the center pixel should be deleted. In the conventional median filter, the center pixel is filled with the configuration's density. While in the first embodiment according to the grouping of FIGS. 2 (1) to (7), (9) to (11), (15) to (17) and (20) to (23), the process result meets the above requirement.

FIG. 7 (4) shows a reversed steplike pattern. The pixel on the step corner is filled with the configuration's density, in the processing according to the first grouping. While a process according to the grouping in FIGS. 2 (12) to (14), (18) to (20), (24) and (26) processes the pattern so as not to fill the pixel on the step corner. The not reversed pattern, the rotationally symmetric pattern of reversed or not reversed pattern, and the axially symmetric pattern of reversed or not reversed pattern are adequately processed by the grouping above, as well.

FIGS. 7 (5) to (7) show diagonal line patterns. The pixel inside of the diagonal should be filled with configuration's density. In the reversed pattern, the inside of the diagonal should be deleted. In the conventional median filter, or in the processing according to the first grouping, the inside pixel is kept as it is. According to the second grouping, the inside pixel is changed, meeting the above requirement. The reversed pattern, the rotationally symmetric pattern of the reversed or not reversed pattern, and the axially symmetric pattern of the reversed or not reversed pattern are adequately processed, as well.

FIG. 7 (8) shows a reversed Y-shaped pattern. The cross point of the Y-shape should not be filled with the configuration's density. However, the conventional median filter and the process according to the first grouping fill the above cross point. The processing according the the second grouping keeps the cross point as it is.

FIG. 7 (9) shows a rotated and reversed short foot L-shaped pattern with an additional dot. The center pixel of the vertical line of the L-shape should not be filled with the configuration's density. However, in the process according to the first grouping, the center pixel is filled with the configuration's density. According to the second grouping, the center pixel is not filled.

FIG. 7 (10) shows a reversed high step-like pattern. The middle pixel of the step should not be filled with the configuration's density. However, according to the first grouping, the middle pixel is filled. According to the second grouping, the middle pixel is not filled.

FIG. 7 (11) shows a rotated and reversed low T-shaped pattern. The center pixel of the horizontal line of T-shape should not be filled with the configuration's density. However, according to the first grouping, the center pixel is filled. According to the second grouping the center pixel is not filled.

The reverse pattern of FIGS. 7 (8) to (11), a rotationally symmetric pattern of reversed or non reversed pattern, and axially symmetric pattern of reversed or not reversed pattern are processed adequately according to the second grouping, as well.

FIG. 7 (12) shows a reversed box with one dot hole. The center pixel corresponding to the hole should be deleted so as to make the box holeless. However, the conventional median filter and the processing according to the first grouping keep the center pixel as it is. According to the second grouping of FIGS. 2 (14), (15), (19), (21), (26) and (27), the center pixel is deleted. The reversed pattern of the pattern in FIG. 7 (12), rotationally symmetric patterns of the reversed or not reversed pattern, and axially symmetric patterns of the reversed or not reversed pattern are adequately processed, as well.

FIG. 7 (13) shows a crossing pattern. The center pixel of the crossing should not be deleted. However, the center pixel is deleted, according to the first grouping. The center pixel is not deleted according to the grouping in FIGS. 2 (1), (3), (4), (6), (7), (9) to (12), (14), (19), (21) to (24) and (26).

The second grouping has process results 88% similar to that of the first grouping. Particularly the grouping in FIGS. 2 (2), (4), (5), (8), (13), (15), (17), (18), (20), (25) and (27) include a lot of better process results than those of the first grouping.

The process result of the third grouping (FIG. 3), the fourth grouping (FIG. 4) and the fifth grouping are identical in 86% 83% and 81% of the patterns, respectively, with the process result of the first grouping whose high quality has already been shown.

Furthermore, the second to the fifth groupings have process results 90% identical with the conventional median filter.

Hereinafter, the second embodiment is described in detail.

In FIG. 14, a 3×3 convolution is shown with references a to i in an order along the scan line.

The following calculation is performed in the second embodiment.

$$Med\{d, Med\{b,e,h\},f\} \tag{2}$$

or $$Med\{b, Med\{d,e,f\},h\} \tag{3}$$

where,
b, d, e, f, h: Density of the pixels designated by these references.

The median calculation in the above formula (2) is simplified as follows;

$$Med\{b,e,h\} = Max\{Min\{b,e\}, Min\{e,h\}, Min\{h,b\}\} \tag{4}$$

or $$Med\{b,e,h\} = Min\{Max\{b,e\}, Max\{e,h\}, Max\{h,b\}\} \tag{5}$$

The above calculations (2) and (3) mean a median calculation of a horizontal and vertical crossing pattern. This calculation is much simpler and takes much shorter calculation time than the first embodiment.

When the center pixel of the convolution is positioned on the cross point of the crossing, the calculation represents a total characteristic of the convolution.

The crossing may be changed to an oblique crossing. The calculation for an oblique crossing is as follows;

$$Med\{a, Med\{c,e,g\},i\} \tag{6}$$

or $$Med\{c, Med\{a,e,i\},g\} \tag{7}$$

FIG. 15 shows a 5×5 convolution in which references a to y in an order along the scan line are given.

The crossing pattern median calculation can be applied to the 5×5 convolution, as well. The calculation is performed as follows;

$$Med\{k,l, Med\{c,h,m,r,w\},n,o\} \tag{8}$$

or $$Med\{c,h, Med\{k,l,m,n,o\},r,w\} \tag{9}$$

or $$Med\{e,i, Med\{a,g,m,s,y\},q,u\} \tag{10}$$

or $$Med\{a,g, Med\{e,i,m,q,u\},s,y\} \tag{11}$$

Figure 16:
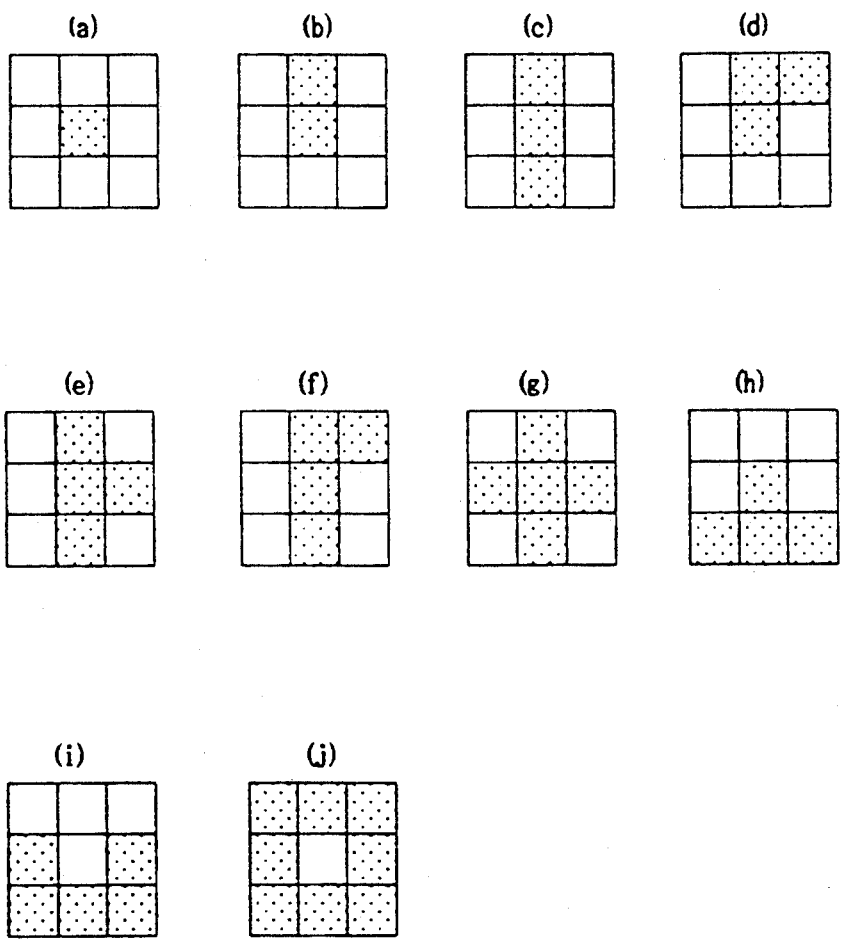
FIGS. 16 a-j shows dot patterns to be deleted by the second embodiment.
Figure 17:
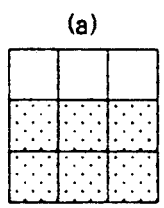
FIGS. 17 a-l show dot patterns not to be deleted.
Figure 17:
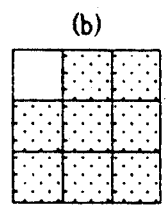
Figure 17:
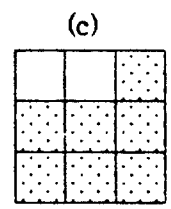
Figure 17:
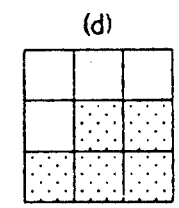
Figure 17:
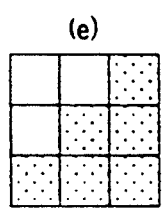
Figure 17:
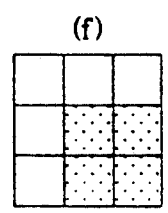
Figure 17:
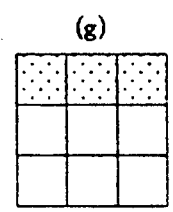
Figure 17:
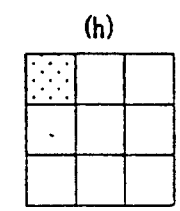
Figure 17:
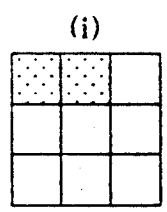
Figure 17:
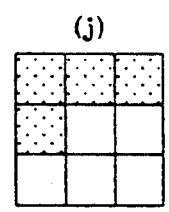
Figure 17:
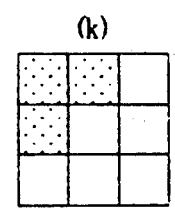
Figure 17:
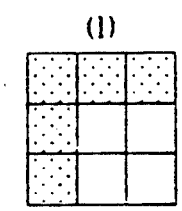

Table 2 shows the process result of the formula (2), (3), (6), (7) and the conventional median filter, with respect to the pattern in FIGS. 16 (a) to (j) and FIGS. 17 (a) to (l).

TABLE 2

| Pattern | | Formula (2) | Formula (3) | Formula (6) | Formula (7) | Conventional Median Filter |
|---|---|---|---|---|---|---|
| FIG. 16 | (a) | 0 | 0 | 0 | 0 | 0 |
| | (b) | 0 | 0 | 0 | 0 | 0 |
| | (c) | 0 | 1 | 0 | 0 | 0 |
| | (d) | 0 | 0 | 0 | 0 | 0 |
| | (e) | 1 | 1 | 0 | 0 | 0 |
| | (f) | 0 | 1 | 0 | 0 | 0 |
| | (g) | 1 | 1 | 0 | 0 | 1 |
| | (h) | 0 | 0 | 1 | 1 | 0 |
| | (i) | 1 | 1 | 0 | 0 | 1 |
| | (j) | 1 | 1 | 1 | 1 | 1 |
| FIG. 17 | (a) | 1 | 1 | 1 | 1 | 1 |
| | (b) | 1 | 1 | 1 | 1 | 1 |
| | (c) | 1 | 1 | 1 | 1 | 1 |
| | (d) | 1 | 1 | 1 | 1 | 1 |
| | (e) | 1 | 1 | 1 | 1 | 1 |
| | (f) | 1 | 1 | 0 | 0 | 0 |
| | (g) | 0 | 0 | 0 | 0 | 0 |
| | (h) | 0 | 0 | 0 | 0 | 0 |
| | (i) | 0 | 0 | 0 | 0 | 0 |
| | (j) | 0 | 0 | 0 | 0 | 0 |
| | (k) | 0 | 0 | 0 | 0 | 0 |
| | (l) | 0 | 0 | 1 | 1 | 1 |

The patterns in FIG. 16 are processed by the formula (2), (3), (6) and (7) similar to the conventional median filter. With respect to the patterns in FIG. 17, the calculation results of the formulas have advantages in that one-dot lines crossing the convolution are usually preserved.

What is claimed is:

1. An image processing method for smoothing without dulling edges, comprising the steps of:
 representing an image as image pixels;
 grouping image pixels of a predetermined convolution into a plurality of groups, each including a plurality of pixels;
 calculating a median for each said group of image pixels;
 calculating a median of all said group medians; and altering a pixel of a group in accordance with the median of said medians so as to generate a smoothed image.

2. An image processing method according to claim 1, wherein said convolution consists of square area.

3. An image processing method according to claim 1, wherein:
 each said group of pixels includes the same number of pixels.

4. An image processing method according to claim 1, wherein each of said groups consists of horizontally aligned pixels in said convolution.

5. An image processing method according to claim 1, wherein each of said groups consists of vertically aligned pixels in said convolution.

6. An image processing method for smoothing without dulling edge, comprising the steps of:
 representing an image as image pixels,
 for a predetermined convolution, calculating a median of pixels included in a first line passing substantially through the middle of said convolution; and
 calculating a median of all pixels included in a second line of said convolution crossing said first line substantially perpendicularly except that pixel also included in said first line, and said calculated median of said first line; and
 altering a pixel of a group in accordance with the medians of said medians so as to generate a smoothed image.

7. An image processing method according to claim 6, wherein said first line is horizontal.

8. An image processing method according to claim 6, wherein said first line is vertical.

9. An image processing method according to claim 6, wherein said first line is inclined.

10. An image processing method according to claim 9, wherein said first line is a substantially diagonal line of said convolution.

* * * * *